US009607983B2

(12) United States Patent
Ichikawa

(10) Patent No.: US 9,607,983 B2
(45) Date of Patent: Mar. 28, 2017

(54) SEMICONDUCTOR DEVICE

(71) Applicant: ROHM CO., LTD., Kyoto (JP)

(72) Inventor: Daisuke Ichikawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/307,878

(22) Filed: Jun. 18, 2014

(65) Prior Publication Data

US 2014/0374837 A1 Dec. 25, 2014

(30) Foreign Application Priority Data

Jun. 25, 2013 (JP) ................................. 2013-132890

(51) Int. Cl.
*H01L 27/088* (2006.01)
*H01L 27/12* (2006.01)

(52) U.S. Cl.
CPC ........ *H01L 27/088* (2013.01); *H01L 27/1203* (2013.01)

(58) Field of Classification Search
CPC ........... H01L 27/0922; H01L 29/66659; H01L 29/66674; H01L 29/7801; H01L 29/7835
See application file for complete search history.

(56) References Cited

U.S. PATENT DOCUMENTS

| 2010/0187639 | A1 | 7/2010 | Iwamoto |
| 2010/0301412 | A1* | 12/2010 | Parthasarathy ..... H01L 27/0629 257/337 |
| 2012/0228711 | A1* | 9/2012 | Hoshino ........................ 257/368 |
| 2013/0256800 | A1* | 10/2013 | Qiao et al. .................... 257/350 |

FOREIGN PATENT DOCUMENTS

JP 2010-177342 A 8/2010

* cited by examiner

*Primary Examiner* — Earl Taylor
*Assistant Examiner* — Samuel Park
(74) *Attorney, Agent, or Firm* — Chen Yoshimura LLP

(57) ABSTRACT

A semiconductor device is formed, the semiconductor device including: an SOI substrate; field insulating films that are formed on the SOI substrate and that separate a plurality of element formation regions; first and second HV pMOSs, and first and second LV pMOSs that are formed in the plurality of element formation regions; a first interlayer insulating film and a second interlayer insulating film formed on the SOI substrate; a mold resin formed on the second interlayer insulating film; and conductive films that are formed on the first interlayer insulating film and that are interposed between the plurality of element formation regions, and the field insulating films and mold resin.

17 Claims, 11 Drawing Sheets

SEMICONDUCTOR DEVICE

BACKGROUND OF THE INVENTION

Field of the Invention

The present invention relates to a semiconductor device.

Description of Related Art

Patent Document 1 discloses a semiconductor device that includes a p-type silicon substrate, a field insulating film that is formed on the silicon substrate and that separates a high withstand voltage region from a low withstand voltage region, and an interlayer insulating film formed on the silicon substrate. The high withstand voltage region further has formed therein a first high withstand voltage MOS transistor and a second high withstand voltage MOS transistor that are separated from each other by the field insulating film. The low withstand voltage region has formed therein a low withstand voltage MOS transistor.

RELATED ART DOCUMENT

Patent Document

Patent Document 1: Japanese Patent Application Laid-Open Publication No. 2010-177342

SUMMARY OF THE INVENTION

Generally, in a manufacturing process for a semiconductor device, a final step of sealing a substrate by a mold resin is performed. In the semiconductor device of Patent Document 1, a mold resin is formed on an interlayer insulating film, for example. In this configuration, the inventor of the present invention observed a problem that if a high voltage of 600V or greater is applied as the reference voltage to a high withstand voltage region, there is a leakage current, and confirmed that the cause of this problem is mobile ions in the mold resin (negative ions such as Cl$^-$ ions or positive ions such as Na$^+$ ions, for example).

The occurrence of such leakage current is described below. If 600V is applied as a reference voltage in the high withstand voltage region, mobile ions (negative ions) in the mold resin are drawn to the semiconductor region, which results in a charge building up in the boundary between the mold resin and the interlayer insulating film. An electric field due to these mobile ions draws in ions of a polarity opposite to that of the mobile ions in the area directly below the field insulating film (positive ions), and this results in field inversion occurring in the area directly below the field insulating film, creating a leakage path. As a result, conduction occurs between elements adjacent to each other through the leakage path, causing a defect in element separation. In addition, because the mobile ions building up in the boundary between the mold resin and the interlayer insulating film in this manner continue to remain in the boundary even after the reference voltage is stopped, it is not possible to stop the occurrence of undesired leakage current.

The occurrence of such leakage voltage is referred to as charge creep, and is a cause for a large decrease in reliability of semiconductor devices.

An object of the present invention is to provide a semiconductor device that mitigates the occurrence of leakage current resulting from mobile ions in the mold resin, thereby ensuring excellent reliability in the semiconductor device.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides semiconductor device according to a first aspect, including: a semiconductor layer; at least one insulating film pattern (insulating film) that is formed on the semiconductor layer, defining a plurality of element formation regions therein; semiconductor elements formed in the element formation regions; an interlayer insulating layer (interlayer insulating film) formed on the semiconductor layer; a mold resin formed over the interlayer insulating layer; and at least one conductive film formed in the interlayer insulating film, the conductive film being disposed over at least either of the element formation regions and the insulating film pattern.

According to this configuration, it is possible for the conductive film to reduce the effect of an electric field caused by mobile ions in the mold resin. In other words, even if the mobile ions in the mold resin are drawn towards the semiconductor layer to build up a charge, it is possible to have ions of a polarity opposite to the mobile ions to build up in the conductive film disposed closer to the mold resin than the semiconductor layer. As a result, it is possible to reduce the effect of the electric field due to mobile ions in the mold resin on the semiconductor layer directly below the insulating film.

Thus, it is possible to mitigate field inversion caused by mobile ions and ions of the opposite polarity being drawn to the region directly below the insulating film. As a result, it is possible to mitigate the occurrence of leakage current between adjacent element formation regions, and thus, it is possible to provide a semiconductor device having excellent reliability.

In a second aspect, the present disclosure provides the semiconductor device according to the first aspect, further including a region separating structure in the semiconductor layer, the region separating structure separating the semiconductor layer into a low voltage region that operates at a low reference voltage and a high voltage region that operates at a high reference voltage that is higher than the low reference voltage, wherein at least some of the plurality of element formation regions are included in the high voltage region, and wherein the at least one conductive film includes a conductive film (high voltage region conductive film) disposed over the high voltage region.

In a semiconductor device having a region separating structure in which the semiconductor layer is divided into a low voltage region and a high voltage region, the mobile ions in the mold resin have a tendency to be drawn towards the high voltage region, which has a relatively high reference voltage.

Thus, according to this configuration, it is possible to reduce the electric field in the high voltage region where mobile ions in the mold resin are particularly susceptible to be drawn towards the semiconductor layer. As a result, it is possible to effectively mitigate the occurrence of leakage current in the high voltage region.

In a third aspect, the present disclosure provides the semiconductor device according to the second aspect, wherein at least some of the plurality of element formation regions are included in the low voltage region, and wherein the at least one conductive film includes a conductive film (low voltage region conductive film) disposed over the low voltage region.

As described above, the mobile ions in the mold resin have a tendency to be drawn towards the high voltage region, and as a result of the movement of the mobile ions, in the low voltage region, many ions of a polarity opposite to that of the mobile ions in the high voltage region build up. As a result, if a configuration in which conductive films are not provided, unlike in the present invention, field inversion occurs in the low voltage region due to mobile ions and same polarity ions being drawn to the region directly below the insulating film, thus resulting in a risk of leakage current occurring.

Thus, according to the configuration of the third aspect, the low voltage region conductive film is formed in the low voltage region, and thus, even if a large number of opposite polarity ions build up in the low voltage region and form an electric field, it is possible to reduce the effect of this electric field due to the low voltage region conductive film. As a result, it is possible to effectively mitigate the occurrence of field inversion in the low voltage region.

In a fourth aspect, the present disclosure provides the semiconductor device according to any one of the first to third aspects, wherein the semiconductor elements include a MOS transistor including a gate insulating film formed on a surface of the semiconductor layer.

According to this configuration, a conductive film is interposed between the MOS transistor and the mold resin. As a result, it is possible to mitigate inversion in the channel due to mobile ions and opposite polarity ions being drawn towards the channel region of the MOS transistor. As a result, it is possible to mitigate leakage current due to conduction in the channel region of the MOS transistor when the MOS transistor is OFF.

In a fifth aspect, the present disclosure provides the semiconductor device according to the fourth aspect, wherein the conductive film is at the same potential as a source region of the MOS transistor.

According to this configuration, the same voltage as the source region, that is, reference voltage, is applied to the conductive film. As a result, the electric field due to mobile ions in the mold resin can be forcibly stopped in the conductive film. As a result, it is possible to effectively mitigate the occurrence of undesired leakage current notwithstanding the ion buildup in surrounding areas.

In a sixth aspect, the present disclosure provides the semiconductor device according to the fourth or fifth aspect, wherein the conductive film is made of a wiring film formed integrally with and in the same layer as a source wiring film connected to a source region of the MOS transistor, the conductive film extending to a region over a gate of the MOS transistor and the insulating film pattern.

According to this configuration, it is possible to not only reliably mitigate field inversion in the region directly below the insulating film, but to reliably mitigate inversion in the channel region of the MOS transistor. As a result, it is possible to effectively mitigate leakage current in the region directly below the insulating film and in the channel region.

Also, according to this configuration, in the manufacturing process for the semiconductor device, it is possible to form the conductive film in the same step as forming the source wiring film. In other words, by simply changing the layout of the resist mask in the manufacturing process for the semiconductor device, it is possible to form the source wiring film and the conductive film simultaneously. Thus, there is no need to add a new manufacturing step, thereby preventing an increase in the number of steps.

Also, the conductive film may be disposed in a wiring layer directly above a gate of the MOS transistor as in the invention according to a seventh aspect.

It is preferable that the conductive film be formed so as to cover a channel region and a source region of the MOS transistor in the element formation region in a plan view from a direction perpendicular to a surface of the semiconductor layer as in the invention according to an eighth aspect.

Even in this case, the conductive film may be formed so as to avoid a portion of a drain region of the MOS transistor in a plan view from the direction perpendicular to the surface of the semiconductor layer as in the invention according to a ninth aspect.

In a tenth aspect, the present disclosure provides the semiconductor device according to any one of the first to ninth aspects, wherein a passivation film made of silicon nitride and having an index of refraction of 2.0 or greater is disposed between the interlayer insulating film and the mold resin.

According to this configuration, a passivation film having a relatively small band gap is interposed between the interlayer insulating film and the mold resin. In other words, a passivation film having a relatively high conductivity is formed. As a result, when the voltage of the semiconductor device is OFF, it is possible to reduce the buildup of mobile ions. As a result, it is possible to eliminate the occurrence of unwanted leakage current.

In this case, it is preferable that the index of refraction of the passivation film be 2.3 or greater as in the invention according to an eleventh aspect.

Also, the passivation film may be in contact with the mold resin as in the invention according to a twelfth aspect.

It is to be understood that both the foregoing general description and the following detailed description are exemplary and explanatory, and are intended to provide further explanation of the invention as claimed.

DETAILED DESCRIPTION OF THE PREFERRED EMBODIMENTS

Below, embodiments of the present invention will be explained in detail with reference to appended drawings.

Figure 1A:
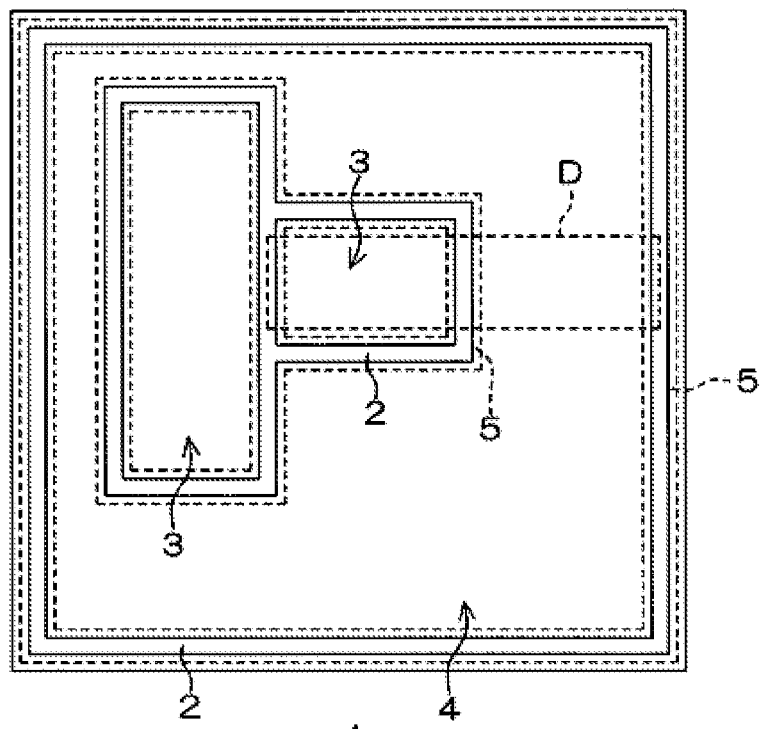
FIG. 1A is a schematic plan view of a semiconductor device according to Embodiment 1 of the present invention.
Figure 1B:
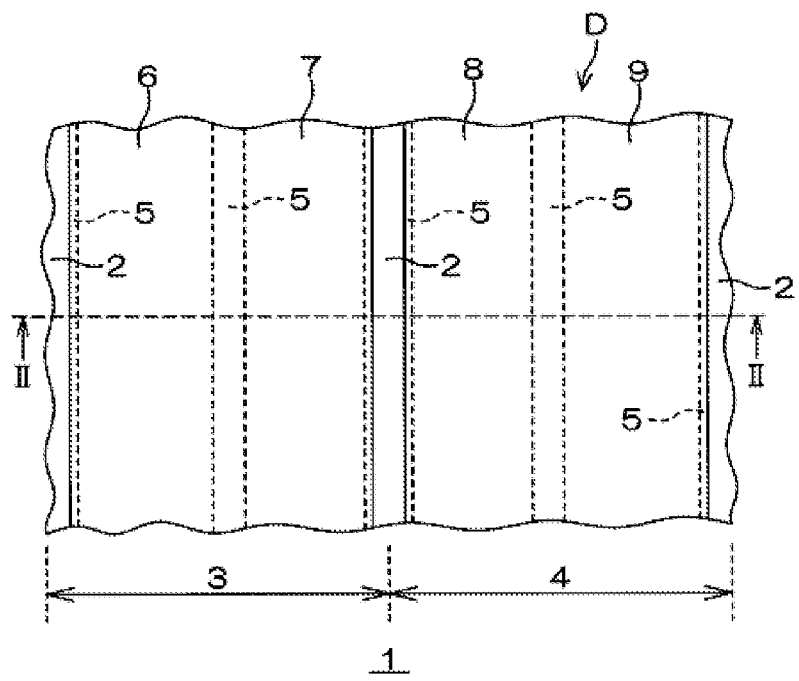
FIG. 1B is a magnified plan view of the region in FIG. 1A surrounded by a broken line.

FIG. 1A is a schematic plan view of a semiconductor device 1 according to Embodiment 1 of the present invention. FIG. 1B is a magnified plan view of a region D in FIG. 1A surrounded by a broken line.

The semiconductor device 1 includes an SOI substrate 10 as an example of a semiconductor layer of the present invention. The semiconductor layer is not limited to being the SOI substrate 10, and may be a so-called bulk substrate. The SOI substrate 10 has formed thereon a high voltage region 3 and a low voltage region 4 separated by an element separating structure 2.

The element separating structure 2 is formed so as to respectively surround the peripheries of the high voltage region 3 and the low voltage region 4 such that the high voltage region 3 and the low voltage region 4 are separated. More specifically, in the present embodiment, the high voltage region 3 is formed in a region surrounded in a protruding shape by the element separating structure 2 in a plan view as viewed from the direction normal to the surface of the SOI substrate 10. On the other hand, the low voltage region 4 is formed in a region outside of the region where the high voltage region 3 is formed, within the region surrounded in a rectangular shape in a plan view by the element separating structure 2.

FIG. 1A shows one example of how the high voltage region 3 and the low voltage region 4 are arranged, but the arrangement is not limited thereto. The high voltage region 3 and the low voltage region 4 simply need to be respectively formed in regions surrounded by the element separating structure 2. The element separating structure may be formed so as to surround the high voltage regions 3 and the low voltage region 4 in a circular shape, or the element separating structure may be formed so as to surround the high voltage region 3 and the low voltage region 4 in a polygonal shape.

The region D surrounded by the broken line in FIG. 1A includes a portion of the high voltage region 3 and a portion of the low voltage region 4. The region D is a region where a high voltage semiconductor element and a low voltage semiconductor element are formed as described below. In the present embodiment, the low voltage region 4 is a region where, besides a low voltage semiconductor element, various low withstand voltage elements such as low withstand voltage logic circuits are formed, but an example will be described in which a low voltage semiconductor element is formed in the region D.

As shown in FIG. 1B, field insulating films 5 are formed as an example of an insulating film of the present invention on the regions where the element separating structures 2 are formed. In a plan view, the field insulating films 5 are formed at along the element separating structures 2, at a greater width than the element separating structures 2. The field insulating films 5 further include a portion that separates the high voltage region 3 into a first high voltage element formation region 6 and a second high voltage element formation region 7, and a portion that separates the low voltage region 4 into a first low voltage element formation region 8 and a second low voltage element formation region 9.

In other words, the first high voltage element formation region 6 and the second high voltage element formation region 7, and the first low voltage element formation region 8 and the second low voltage element formation region 9 are respectively formed in regions surrounded by the field insulating films 5.

In the present embodiment, a configuration in which two high voltage element formation regions 6 and 7 are included in the high voltage region 3 and two low voltage element formation regions 8 and 9 are included in the low voltage region 4 will be described, but a configuration may be adopted in which the high voltage region 3 and the low voltage region 4 include three or more high voltage element formation regions and low voltage element formation regions, respectively.

The high voltage region 3 is a region where a semiconductor element operating at a relatively high reference voltage is formed, with a voltage of 100V to 200V being applied thereto, for example. The low voltage region 4 is a region where a semiconductor element operating at a lower reference voltage than the high voltage region 3 is formed, with a voltage of 5V to 100V being applied thereto, for example.

Figure 2:
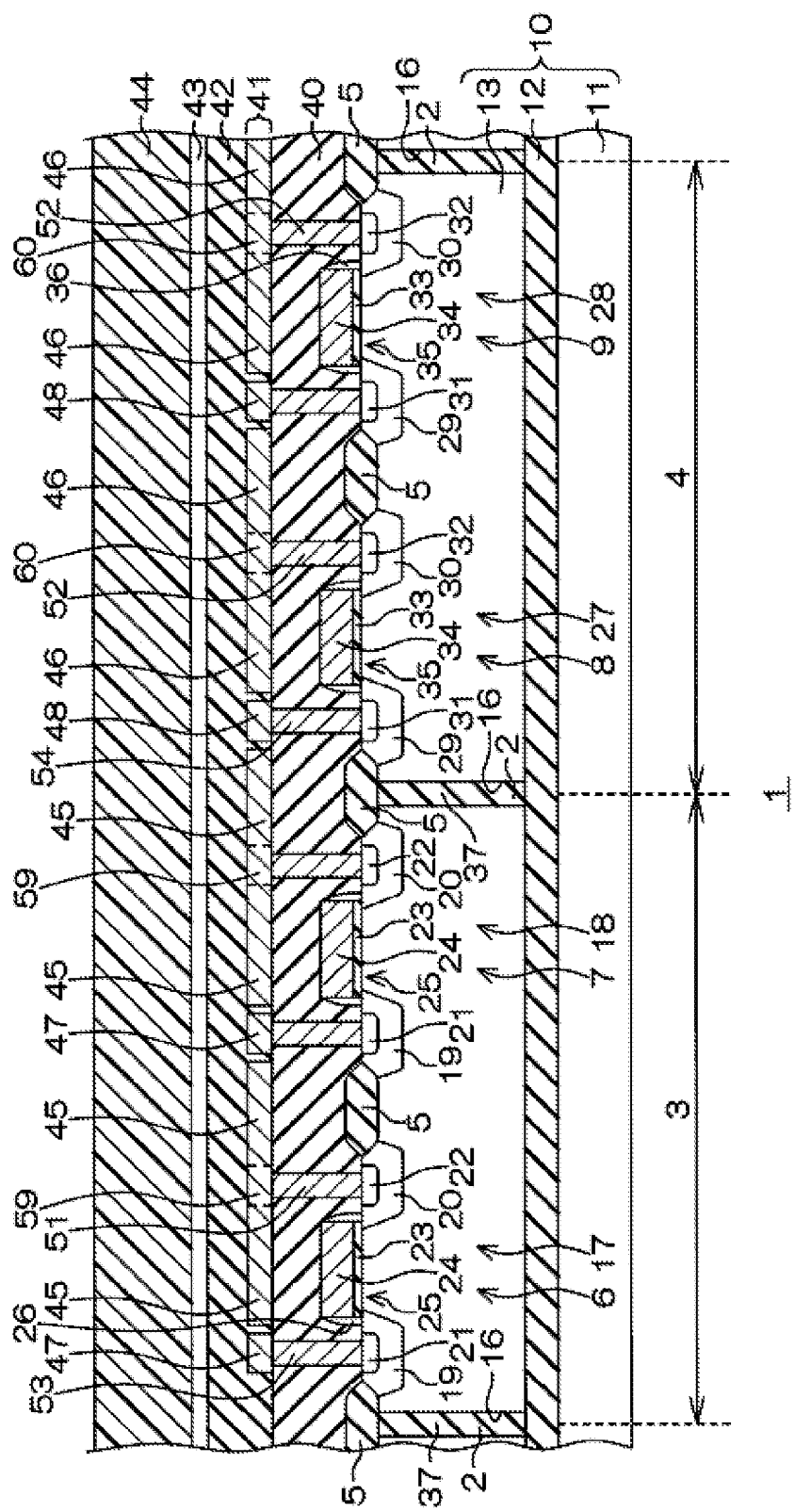
FIG. 2 is a cross-sectional view of FIG. 1B along the line II-II.

Next, with reference to FIG. 2, the cross-sectional structure of the semiconductor device 1 will be described in detail. FIG. 2 is a cross-sectional view of FIG. 1B along the line II-II.

The SOI substrate 10 includes a p-type support substrate 11, an embedded insulating layer 12 formed on the support substrate 11, and an epitaxial layer 13 formed on the embedded insulating layer 12. The support substrate 11 is a silicon substrate, for example, and the impurity concentration thereof is $1.0 \times 10^{14}$ cm$^{-3}$ to $1.0 \times 10^{16}$ cm$^{-3}$. Examples of the p-type impurity include B (boron) and Al (aluminum), for example.

The embedded insulating layer 12 is a BOX layer including a silicon oxide formed by oxidizing the surface of the support substrate 11, and is formed at a thickness of 3 μm to 5 μm, for example. The thickness of the embedded insulating layer 12 can be modified as appropriate depending on the specifications (voltage to be used, for example) of the semiconductor device 1, and may be different between the high voltage region 3 and the low voltage region 4.

The epitaxial layer 13 is formed of silicon at a thickness of 20 μm to 30 μm, for example. The epitaxial layer 13 is an n⁻ region doped with an n-type impurity, and the impurity concentration thereof is $1.0 \times 10^{14}$ cm$^{-3}$ to $1.0 \times 10^{16}$ cm$^{-3}$. Examples of the n-type impurity include P (phosphorus) and As (arsenic), for example. The thickness and concentration of the epitaxial layer 13 stated above are merely examples, and the values thereof are not limited thereto. For example, if the impurity concentration of the epitaxial layer 13 is decreased, the thickness of the epitaxial layer 13 can be increased, and if the impurity concentration of the epitaxial layer 13 is increased, the thickness of the epitaxial layer 13 can be decreased.

The element separating structures 2 have a DTI (deep trench isolation) structure in the present embodiment, and include element separating trenches 16 that extend from the surface of the epitaxial layer 13 and reach the embedded insulating layer 12, and embedded portions 37 that are an insulating material (a silicon oxide, for example) embedded in the element separating trenches 16. As a result, in the SOI substrate 10, the epitaxial layer 13 is separated into the high voltage region 3 and the low voltage region 4 on the embedded insulating layer 12, the high voltage region 3 and the low voltage region 4 being surrounded by the element separating structures 2.

The field insulating films 5 are LOCOS films formed by selectively oxidizing the surface of the epitaxial layer 13, for example. Effects of the present invention can be attained to the greatest degree if there are no conductive films disposed on the field insulating films 5, but conductive films, resistors, capacitive elements, and the like may naturally be disposed on the field insulating films 5.

High withstand voltage MOS transistors that are examples of the semiconductor elements of the present invention are formed in a similar configuration in the first high voltage element formation region 6 and the second high voltage element formation region 7 of the high voltage region 3.

In the first high voltage element formation region 6, a first HV (high voltage)-pMOS 17 is formed, and a second HV-pMOS 18 is formed in the second high voltage element formation region 7. The first HV-pMOS 17 and the second HV-pMOS 18 are high withstand voltage elements both having a voltage rating of greater than 20V and less than or equal to 40V, for example.

The first HV-pMOS 17 and the second HV-pMOS 18 each includes a p⁻ type HV drain region 19 and HV source region 20 selectively formed in the surface of the epitaxial layer at a gap from each other. The surface portions of the HV drain region 19 and the HV source region 20 respectively have a p⁺ type HV drain contact region 21 and a p⁺ type HV source contact region 22 formed in the interiors thereof. An HV gate electrode 24 is formed across an HV gate insulating film 23 on the surface of the epitaxial layer 13 so as to face an HV channel region 25 between the HV drain region 19 and the HV source region 20. Both side faces of the HV gate electrode 24 are covered by side walls 26 made of an insulating material such as a silicon nitride.

The impurity concentration of the HV drain region 19 and the HV source region 20 is $1.0 \times 10^{16}$ cm$^{-3}$ to $1.0 \times 10^{17}$ cm$^{-3}$, for example, and the impurity concentration of the HV drain contact region 21 and the HV source contact region 22 is $1.0 \times 10^{18}$ cm$^{-3}$ to $1.0 \times 10^{20}$ cm$^3$, for example.

Low withstand voltage MOS transistors that are examples of the semiconductor elements of the present invention are formed in a similar configuration in the first low voltage element formation region 8 and the second low voltage element formation region 9 of the low voltage region 4.

The first low voltage element formation region 8 has formed therein a first LV (low voltage)-pMOS 27, and the second low voltage element formation region 9 has formed therein a second LV-pMOS 28. The first LV-pMOS 27 and the second LV-pMOS 28 are low withstand voltage elements both having voltage ratings of less than 40V, for example.

The first LV-pMOS 27 and the second LV-pMOS 28 each includes a p⁻ type LV drain region 29 and LV source region 30 selectively formed in the surface of the epitaxial layer 13 at a gap from each other. The surface portions of the LV drain region 29 and the LV source region 30 respectively have a p⁺ type LV drain contact region 31 and a p⁺ type LV source contact region 32 formed in the interiors thereof. An LV gate electrode 34 is formed across an LV gate insulating film 33 on the surface of the epitaxial layer 13 so as to face an LV channel region 35 between the LV drain region 29 and the LV source region 30. Both side faces of the LV gate electrode 34 are covered by side walls 36 made of an insulating material such as a silicon nitride.

The impurity concentration of the LV drain region 29 and the LV source region 30 is $1.0 \times 10^{16}$ cm$^{-3}$ to $1.0 \times 10^{17}$ cm$^{-3}$, for example, and the impurity concentration of the LV drain contact region 31 and the LV source contact region 32 is $1.0 \times 10^{18}$ cm$^3$ to $1.0 \times 10^{19}$ cm$^{-3}$, for example.

Also, a first interlayer insulating film 40 is formed on the SOI substrate 10 so as to completely cover the high voltage region 3 and the low voltage region 4. A wiring layer 41, a second interlayer insulating film 42, a passivation film 43, and a mold resin 44 are formed on the first interlayer insulating film 40 in this order. The first interlayer insulating film 40 is made of an insulating material such as a silicon oxide, for example.

The wiring layer 41 includes an HV source wiring film 59 and LV source wiring film 60, a high voltage region conductive film 45 and low voltage region conductive film 46 that are examples of a conductive film of the present invention, an HV drain wiring film 47 and an LV drain wiring film 48, and an HV gate wiring film 49 and LV gate wiring film (not shown), all of these wiring films being made of the same material and at the same thickness. The wiring films are aluminum wiring films that are 0.4 μm to 2.0 μm in thickness, for example.

The HV source wiring film 59 and the LV source wiring film 60 are electrically connected respectively to an HV source contact region 22 and an LV source contact region 32 through an HV source contact 51 and an LV source contact 52 that penetrate the first interlayer insulating film 40 in the thickness direction thereof. Similarly, the HV drain wiring film 47 and the LV drain wiring film 48 are electrically connected respectively to the HV drain contact region 21 and the LV drain contact region 31 through the HV drain contact 53 and the LV drain contact 54 that penetrate the first interlayer insulating film 40 in the thickness direction thereof.

In the present embodiment, the high voltage region conductive film 45 and the low voltage region conductive film 46 are formed integrally with the HV source wiring film 59 and the LV source wiring film 60, respectively. More specifically, in the cross-sectional view of FIG. 2, the high voltage region conductive film 45 is formed as a lead-out portion that is led out from the HV source wiring film 59 towards both the HV gate electrode 24 and a side opposite thereto. Similarly, in the cross-sectional view of FIG. 2, the low voltage region conductive film 46 is formed as a lead-out portion that is led out from the LV source wiring film 60 towards both the LV gate electrode 34 and a side opposite thereto.

Also, reference voltages corresponding to the high voltage region 3 and the low voltage region 4 are applied respectively to the HV source wiring film 59 and the LV source wiring film 60. As a result, the reference voltage corresponding to the high voltage region 3 is applied to the high voltage region conductive film 45 that is integral with the HV source wiring film 59. Also, the reference voltage corresponding to the low voltage region 4 is applied in a similar manner to the low voltage region conductive film 46 that is integral with the LV source wiring film 60. The reference voltage may be fixed at a certain voltage or be electrically floating.

The HV gate wiring film 49 and the LV gate wiring film (not shown) are electrically connected respectively to the HV gate electrode 24 and the LV gate electrode 34 through an HV gate contact (not shown) and an LV gate contact (not shown) that penetrate the first interlayer insulating film 40 in the thickness direction thereof.

The second interlayer insulating film 42 is formed over the first interlayer insulating film 40 so as to cover the wiring layer 41. The second interlayer insulating film 42 is made of the same material as the first interlayer insulating film 40, for example.

The passivation film 43 is made of a silicon nitride (SiN), for example. The passivation film 43 is interposed between the second interlayer insulating film 42 and the mold resin 44, and the upper surface of the passivation film 43 is in contact with the mold resin 44. The thickness of the passivation film 43 is 1.0 µm to 2.0 µm, for example, and in the present embodiment, the index of refraction thereof is approximately 2.0.

The passivation film 43 is formed by P-CVD (plasma-enhanced chemical vapor deposition), for example. P-CVD is performed in an atmosphere including $SiH_4$ (silane) gas and $NH_3$ (ammonia) gas. In the present embodiment, the ratio ($SiH_4$:$NH_3$) of the flow rate (ml/min) of the $SiH_4$ and $NH_3$ gases is generally 1:4.

The mold resin 44 is made of an epoxy resin, for example, and the thickness of the portion above the passivation film 43 (the thickness from the upper surface of the passivation film 43 to the upper surface of the mold resin 44, for example) is 5.0 µm to 10.0 µm, for example.

Next, with reference to FIGS. 3A, 3B, 4A, 4B, and 5, the effects of the semiconductor device 1 will be described in comparison with a semiconductor device 57 according to a reference example.

Figure 3A:
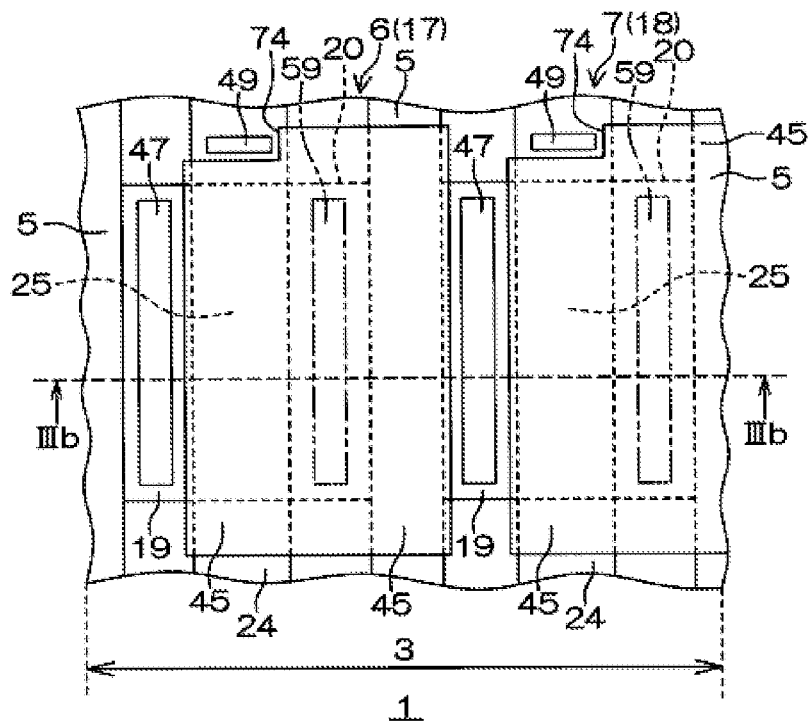
FIG. 3A is a schematic plan view of the semiconductor device of FIGS. 1A and 1B.
Figure 3B:
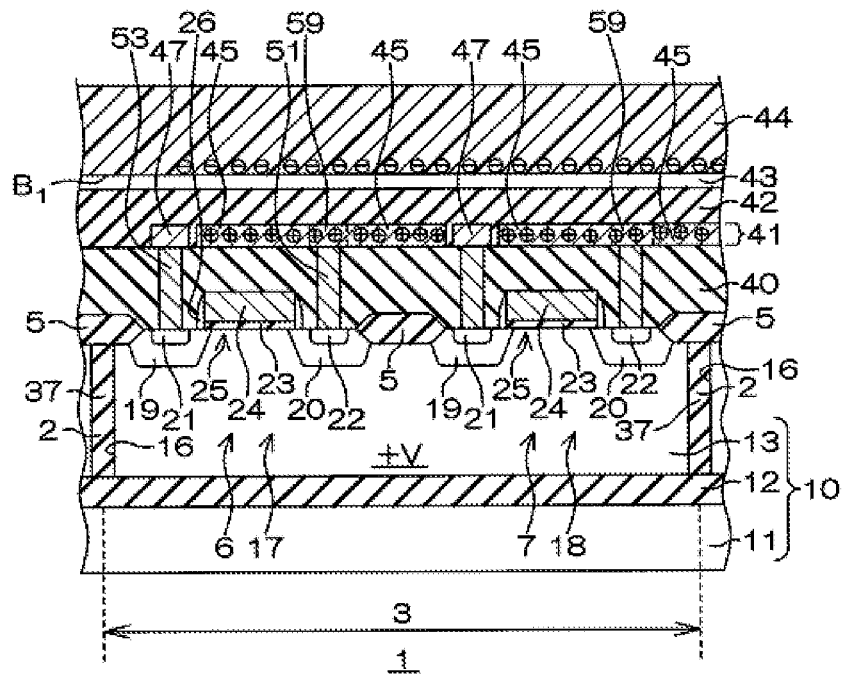
FIG. 3B is a cross-sectional view of FIG. 3A along the line IIIb-IIIb.
Figure 4A:
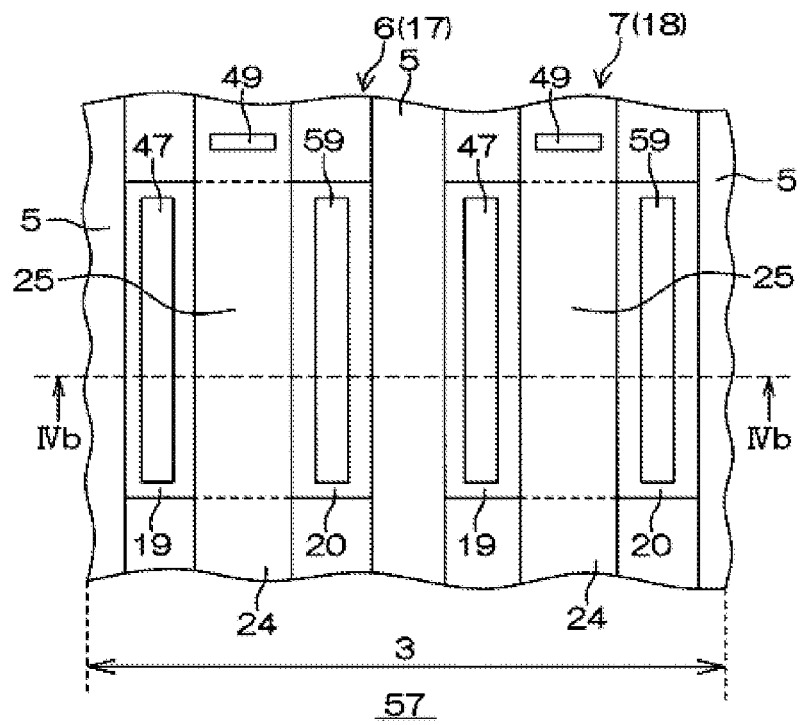
FIG. 4A is a schematic plan view of a semiconductor device according to a reference example.
Figure 4B:
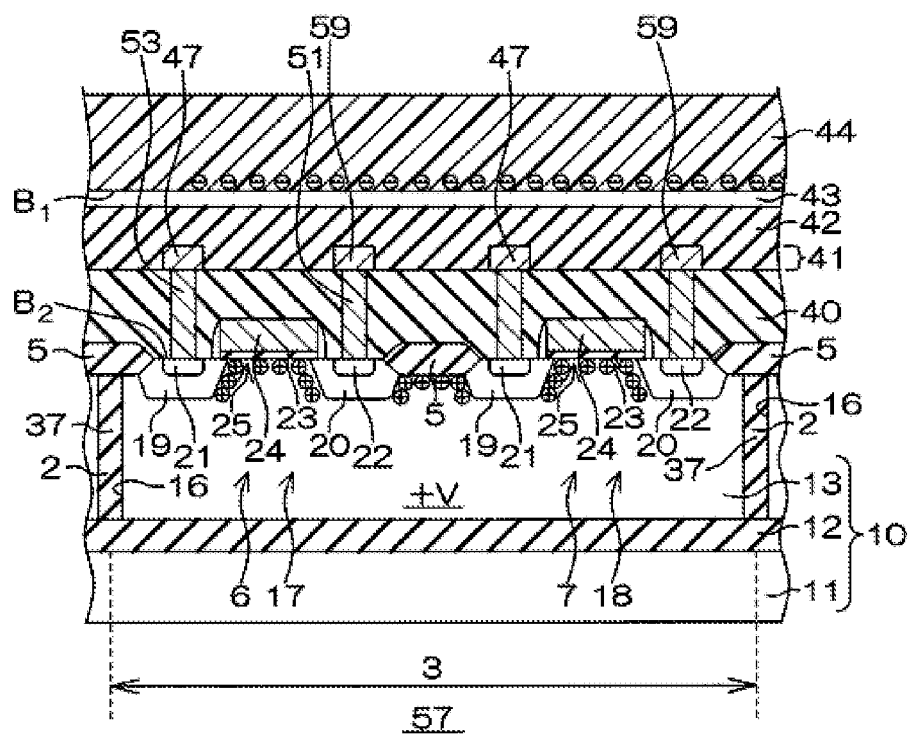
FIG. 4B is a cross-sectional view of FIG. 4A along the line IVb-IVb.
Figure 5:
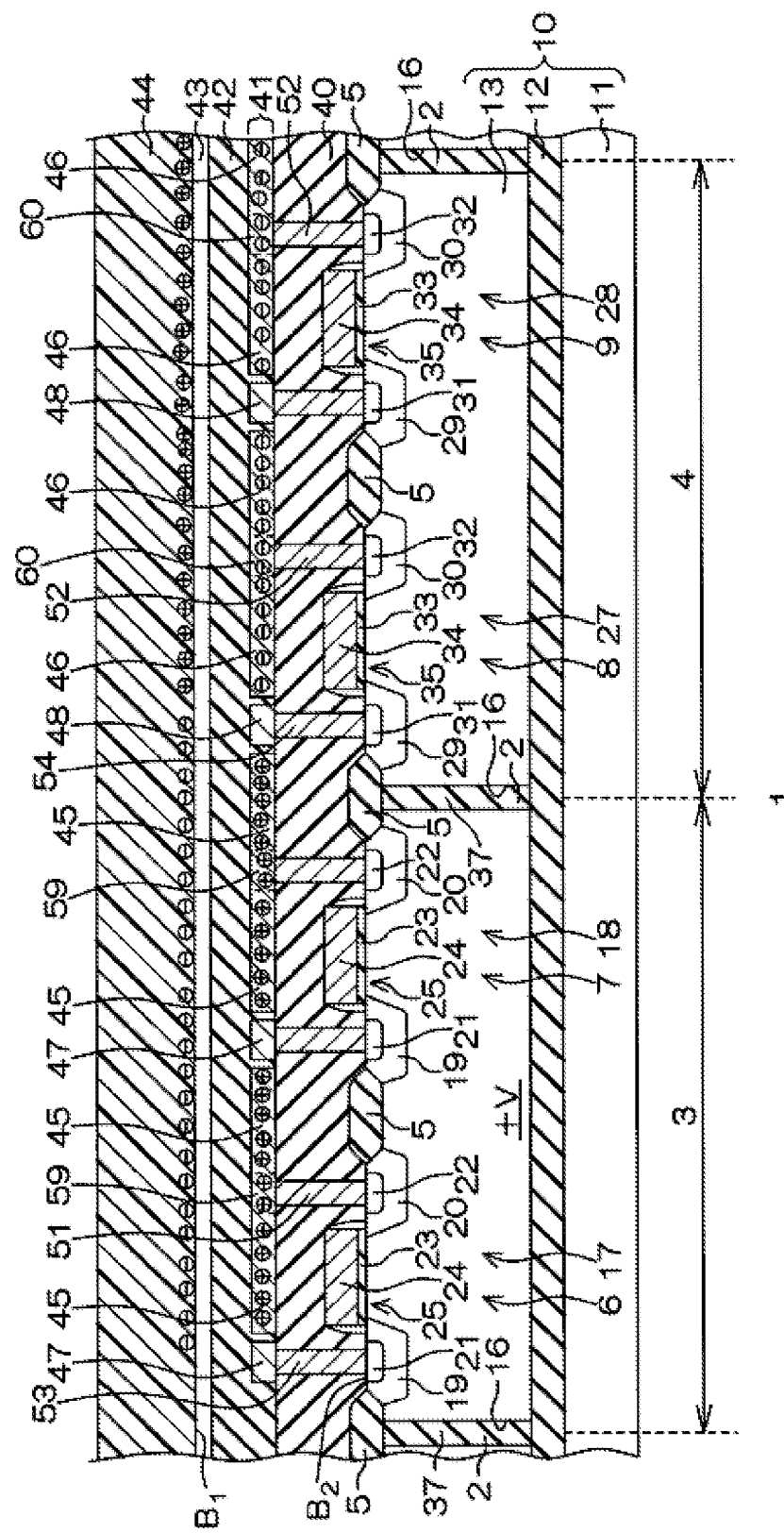
FIG. 5 is a cross-sectional view for describing the movement of ions in the semiconductor device in FIGS. 1A and 1B.

FIG. 3A is a schematic plan view of the semiconductor device 1 of FIGS. 1A and 1B. FIG. 3B is a cross-sectional view of FIG. 3A along the line IIIb-IIIb. FIG. 4A is a schematic plan view of the semiconductor device 57 of the reference example. FIG. 4B is a cross-sectional view of FIG. 4A along the line IVb-IVb. FIG. 5 is a cross-sectional view for describing the movement of ions in the semiconductor device 1 in FIGS. 1A and 1B. Here, the semiconductor device 57 of the reference example has a similar configuration to the semiconductor device 1 with the exception that the semiconductor device 57 does not have the high voltage region conductive film 45 or the low voltage region conductive film 46. In FIGS. 3A, 3B, 4A, and 4B, only the high voltage region 3 is shown, and the low voltage region 4 is not shown.

Before describing the semiconductor device 1, the plan view layout of the high voltage region 3 will be described in further detail with reference to FIG. 3A.

In the present embodiment, the HV drain region 19 and the HV source region 20 are formed in a stripe pattern in a plan view with a gap therebetween, the HV drain region 19 and HV source region 20 having the same rectangular shape in a plan view, for example. The line-shaped region sandwiched between the HV drain region 19 and the HV source region 20 is the HV channel region 25, and the HV gate electrode 24 is formed over this HV channel region 25, along the longer side direction of the regions 19 and 22.

The HV gate electrode 24 has portions that avoid the HV drain region 19, the HV source region 20, and the HV channel region 25 in a plan view (that is, portions that do not face the regions 19, 20, or 25). These portions that avoid the regions 19, 20, and 25 are connected to an HV gate contact, and on the HV gate contact, the HV gate wiring film 49 (see FIG. 3B) is disposed. In the present embodiment, both ends in the longer side direction of the HV gate electrode 24 are disposed further to the outside of the ends of the HV drain region 19 and the HV source region 20 in the longer side direction, and thus, both ends of the HV gate electrode 24 avoid the regions 19, 20, and 25. The HV gate wiring film 49 may be formed on only one of the ends of the HV gate electrode 24 as shown in FIG. 3A, or on both ends thereof (not shown).

The HV drain wiring film 47 is formed within the bounds of the inner region of the HV drain region 19 in a plan view. In the present embodiment, the HV drain wiring film 47 is formed in a line shape in a plan view, and the periphery thereof is formed within the bounds of the HV drain region 19 at a gap from the periphery thereof.

The HV source wiring film 59 is also formed within the bounds of the inner region of the HV source region 20 in a plan view in a manner similar to the HV drain wiring film 47. In the present embodiment, the HV source wiring film 59 is formed in a line shape in a plan view, and the periphery thereof is formed within the bounds of the HV source region 20 at a gap from the periphery thereof.

The high voltage region conductive film 45 is formed so as to be integrally led out from the HV source wiring film 59, covering the entire periphery thereof, and surrounds the HV source wiring film 59 in the plan view of FIG. 3A. In the present embodiment, the high voltage region conductive film 45 has a cutout region 74 that is cut out towards the inside from the periphery thereof, and the HV gate wiring film 49 is disposed so as to fit within the cutout region 74.

Also, the outer periphery of the high voltage region conductive film 45 is disposed further outside than the outer peripheries of the HV channel region 25 and the field insulating film 5 opposite thereto with respect to the HV source region 20, along the length direction of the channel (in the present embodiment, the direction crossing the HV drain region 19 and the HV source region 20). As a result, the HV channel region 25 directly below the HV gate electrode 24 and the field insulating film 5 opposite thereto are completely covered by the high voltage region conductive film 45. On the other hand, the HV source region 20 is completely covered by the HV source wiring film 59 and the high voltage region conductive film 45. In the present embodiment, an example is described in which the wiring film in which the HV source wiring film 59 and the high voltage region conductive film 45 are formed integrally, and the boundary between these films is set towards the interior of the HV source region 20. However, this boundary is simply set in this position for ease of description, and the wiring films are integrally formed no matter where the boundary is formed. Thus, depending on the where the boundary between the HV source wiring film 59 and the high voltage region conductive film 45 is set, there are no changes in the characteristics of the integral wiring film.

In the present embodiment, the high voltage region conductive film 45 is formed in the same wiring layer 41 as the HV drain wiring film 47, and thus, in order to maintain insulation between the high voltage region conductive film 45 and the HV drain wiring film 47, a gap is formed therebetween. As a result, in the periphery of the HV drain wiring film 47, a non-wiring region that is directly over the HV drain region 19 but where no wiring film is present is provided, and as a result of the non-wiring region, the high voltage region conductive film 45 selectively covers a portion of the HV drain region 19 in a plan view, while avoiding this portion. Also, in the present embodiment, the high voltage region conductive films 45 formed over the first and second HV-pMOSs 17 and 18 are formed apart from each other.

As mentioned above, in FIG. 3A, only the high voltage region 3 is shown, but the layout of the source, gate, and drain in the high voltage region 3 described with reference to FIG. 3A also applies to the low voltage region 4.

A case in which a reference voltage (+V) is applied to the high voltage regions 3 of the respective semiconductor devices 1 and 57 under such a configuration will be described. The reference voltage (+V) is electrically floating. The voltage in the high voltage region 3 always changes within the range of 0V to a few hundred volts. A voltage that is a few tens of volts higher than the reference voltage (+V) is applied to the HV drain wiring film 47 and the HV gate wiring film 49. When the voltage in the high voltage region 3 is 600V, the voltage in the HV drain wiring film 47 is 630V, and the voltage in the HV gate wiring film 49 is 630V, for example.

As shown in FIG. 4B, when a high voltage is applied to the high voltage region 3 of the semiconductor device 57 of the reference example, mobile ions in the mold resin 44 (negative ions such as Cl$^-$, for example) are drawn towards a boundary face $B_1$ between the passivation film 43 and the mold resin 44, causing a charge to build up there. Due to this charge buildup, in the epitaxial layer 13, mobile ions and opposite polarity ions (that is, positive ions) are drawn towards a boundary face $B_2$ between the epitaxial layer 13 and the first interlayer insulating film 40 due to the electric field of the mobile ions in the mold resin 44, causing a charge to build up there.

The positive ions drawn by the electric field of the mobile ions build up in the region directly below the field insulating film 5 that separates the first high voltage element formation region 6 from the second high voltage element formation region 7, causing field inversion to occur. As a result, a leakage path that electrically connects the first high voltage element formation region 6 and the second high voltage element formation region 7 is formed. As a result, there is a risk that the first high voltage element formation region 6 and the second high voltage element formation region 7 become electrically connected through the leakage path.

The positive ions also build up in the HV channel region 25, and thus, the channel in the HV channel region 25 inverts. As a result, there is a risk that when the first and second HV-pMOSs 17 and 18 are OFF, the HV channel regions 25 become conductive, thus resulting in a leakage current flowing therethrough. In addition, the mobile ions in the mold resin 44 continue to build up even after the reference voltage is stopped, and thus, it is not possible to stop the occurrence of undesired leakage current.

By contrast, in the configuration of the semiconductor device 1 of Embodiment 1, even if mobile ions (negative ions) in the mold resin 44 are drawn to the boundary face $B_1$ between the passivation film 43 and the mold resin 44, it is possible to have the positive ions build up in the high voltage region conductive film 45 disposed closer to the mold resin 44 than the epitaxial layer 13 in response to the charge buildup in the boundary face $B_1$, a reference voltage being applied to the high voltage region conductive film 45. As a result, the electric field resulting from the mobile ions within the mold resin 44 can be forcibly blocked by the high voltage region conductive film 45. Also, even if an electric field is generated by not only mobile ions in the mold resin 44 but also ions that build up in the periphery of the high voltage region 3, it is possible to similarly block the electric field. Thus, it is possible to reliably mitigate field inversion in the region directly below the field insulating film 5, between the first high voltage element formation region 6 and the second high voltage element formation region 7. As a result, it is possible to mitigate effectively the occurrence of leakage current between the first high voltage element formation region 6 and the second high voltage element formation region 7. Also, it is possible to reliably mitigate the inversion of the HV channel regions 25 in the first HV-pMOS 17 and the second HV-pMOS 18. As a result, it is possible to effectively mitigate the occurrence of leakage current in the HV channel region 25.

In this manner, mobile ions in the mold resin 44 have a tendency to be drawn towards the high voltage region 3, and thus, as shown in FIG. 5, more mobile ions and opposite polarity ions (positive ions) build up in the low voltage region 4 in response to the movement of the mobile ions, compared to the high voltage region 3. As a result, in the low voltage region 4, due to the effect of the electric field by the positive ions that have built up in the mold resin 44, negative ions are drawn to directly below the field insulating film 5, and thus, there is a risk of field inversion occurring.

According to the semiconductor device 1 of Embodiment 1, the low voltage region conductive films 46 are formed in the low voltage region 4, and thus, even if a large number of positive ions build up in the low voltage region 4 and an electric field is generated by these ions, the effect of the electric field can be reduced by the low voltage region conductive films 46. As a result, it is possible to effectively mitigate the occurrence of field inversion in the low voltage region 4.

Also, the high voltage region conductive films 45 and the low voltage region conductive films 46 are integrally formed with the HV source wiring film 59 and the LV source wiring film 60, respectively, and are formed as a portion of the same wiring layer 41 as the other wiring films 47 to 49. Thus, in the manufacturing process of the semiconductor device 1, the high voltage region conductive film 45 and the low voltage region conductive film 46 can be formed in the same step as the HV source wiring film 59, the LV source wiring film 60, and other wiring films 47 to 49. In other words, by simply changing the layout of an already present resist mask in the manufacturing process of the semiconductor device 1, these wiring films 45, 46 to 49, 59, and 69 can all be formed simultaneously. Thus, there is no need to add a new manufacturing step, thereby allowing an increase in the number of steps to be prevented.

Next, a semiconductor device 61 of Embodiment 2 of the present invention will be explained with reference to FIG. 6.

Figure 6:
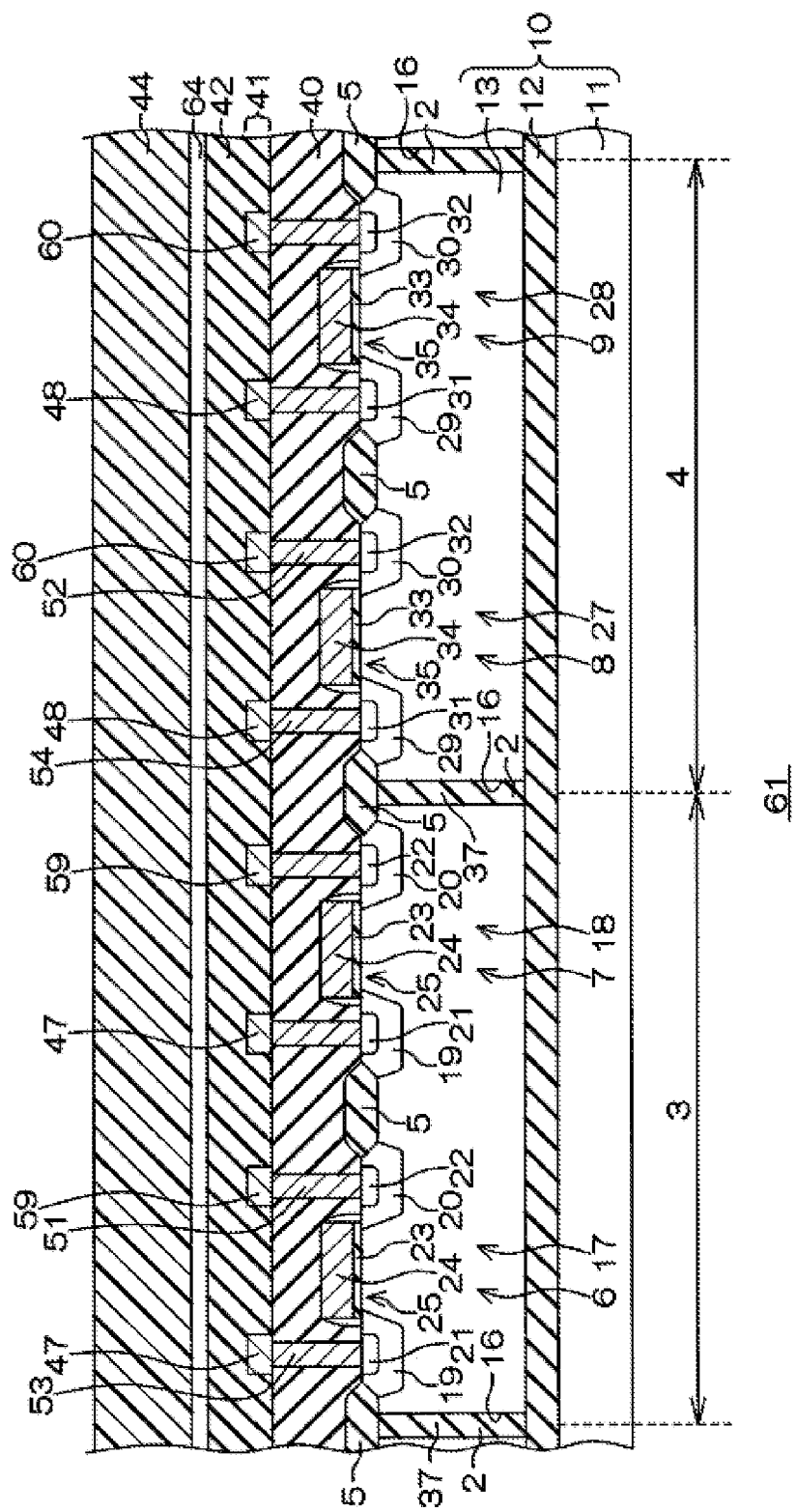
FIG. 6 is a schematic cross-sectional view of a semiconductor device according to Embodiment 2 of the present invention.

FIG. 6 is a schematic cross-sectional view of the semiconductor device 61 according to Embodiment 2 of the present invention. In FIG. 6, portions corresponding to the portions in FIG. 2 are assigned the same reference characters and descriptions thereof will be omitted.

The semiconductor device 61 of Embodiment 2 has a configuration similar to the semiconductor device 1 with the exception that the semiconductor device 61 does not have the high voltage region conductive film 45 or the low voltage region conductive film 46, and that it has, instead of the passivation film 43, a high refraction index passivation film 64 with a higher index of refraction than the passivation film 43.

The high refraction index passivation film 64 is a silicon nitride film that is 1.0 μm to 2.0 μm in thickness, for example, like the passivation film 43 of Embodiment 1. The index of refraction of the high refraction index passivation film 64 is 2.0 or greater, which is higher than that of the passivation film 43. It is preferable that the index of refraction of the high refraction index passivation film 64 be 2.3 or greater. Such a high refraction index passivation film 64 can be formed by modifying the ratio of the flow rate of the $SiH_4$ gas to the flow rate of the $NH_3$ gas.

More specifically, in Embodiment 1, the ratio (SiH$_4$:NH$_3$) of the flow rates (ml/min) of the SiH$_4$ gas and the NH$_3$ gas is generally 1:4, whereas in Embodiment 2, the ratio (SiH$_4$: NH$_3$) of the flow rates (ml/min) of the SiH$_4$ gas and the NH$_3$ gas is generally 1:2. Thus, by having a greater flow rate for the SiH$_4$ gas relative to the flow rate of the NH$_3$ gas compared to Embodiment 1, for example, it is possible to attain a high refraction index passivation film 64 having a relatively high index of refraction (index of refraction of 2.3 or greater).

Figure 7A:
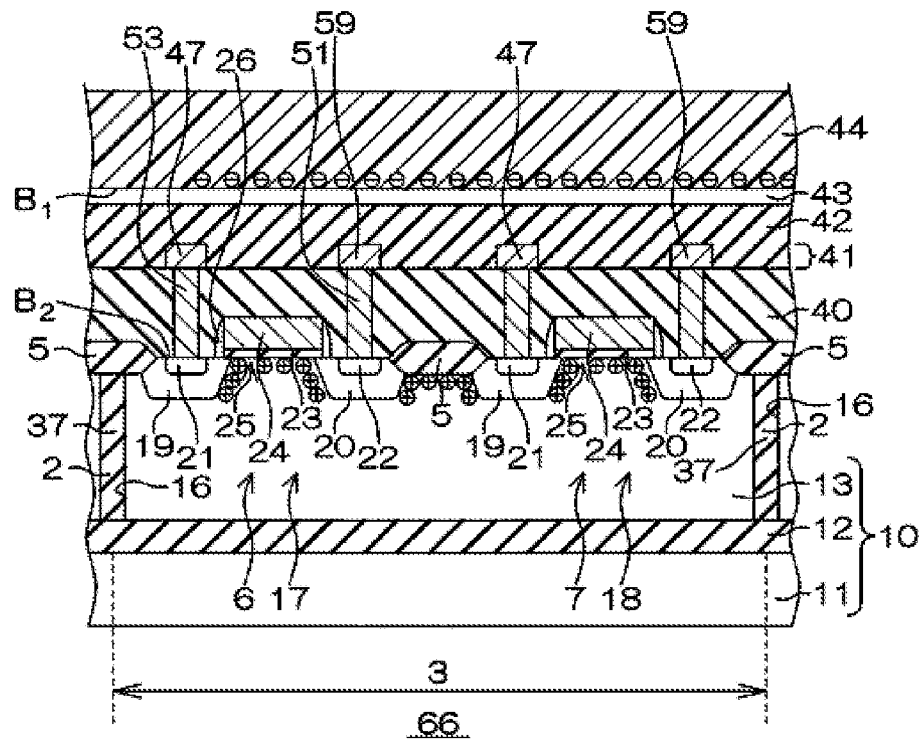
FIG. 7A is a schematic cross-sectional view of a semiconductor device according to a reference example.
Figure 7B:
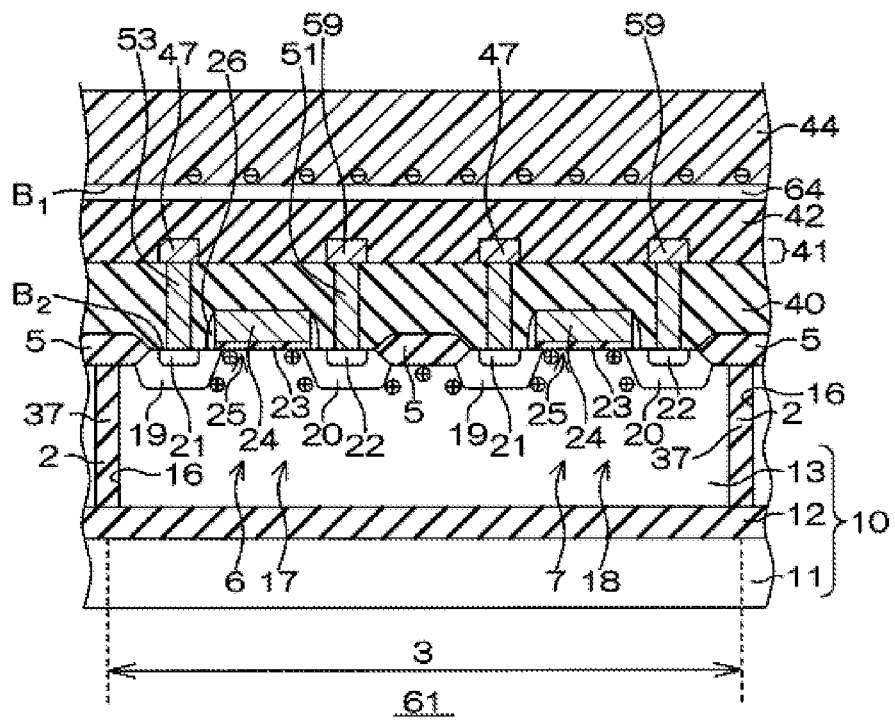
FIG. 7B is a schematic cross-sectional view of the semiconductor device of FIG. 6.

Next, with reference to FIGS. 7A and 7B, the effects of the semiconductor device 61 will be compared to those of a semiconductor device 66 according to a reference example.

FIG. 7A is a schematic cross-sectional view of the semiconductor device 66 of the reference example. FIG. 7B is a schematic cross-sectional view of the semiconductor device 61 of FIG. 6. The semiconductor device 66 of the reference example has a configuration similar to that of the semiconductor device 57 shown in FIG. 4B. In FIGS. 7A and 7B, only the high voltage region 3 is shown, and the low voltage region 4 is not shown.

As shown in FIG. 7A, if a reference voltage similar to that of Embodiment 1 were applied to the high voltage region 3 of the semiconductor device 66 of the reference example, there is a possibility of a leakage current occurring in the region directly below the HV channel region 25 and the field insulating film 5 in a manner similar to the semiconductor device 57 of FIG. 4B.

By contrast, as shown in FIG. 7B, in the semiconductor device 61 of Embodiment 2, the high refractive index passivation film 64 is formed between the second interlayer insulating film 42 and the mold resin 44, the upper surface of the high refractive index passivation film 64 being in contact with the mold resin 44. The high refractive index passivation film 64 has a relatively low band gap; in other words, it has a relatively high conductivity. As a result, even if mobile ions are drawn to a boundary face B$_1$ between the high refraction index passivation film 64 and the mold resin 44 and build up there, it is possible to reduce the buildup of mobile ions when the voltage of the semiconductor device 61 is OFF. As a result, it is possible to stop the occurrence of unwanted leakage current after the voltage has been stopped.

Next, a semiconductor device 71 of Embodiment 3 of the present invention will be explained with reference to FIGS. 8 and 9.

Figure 8:
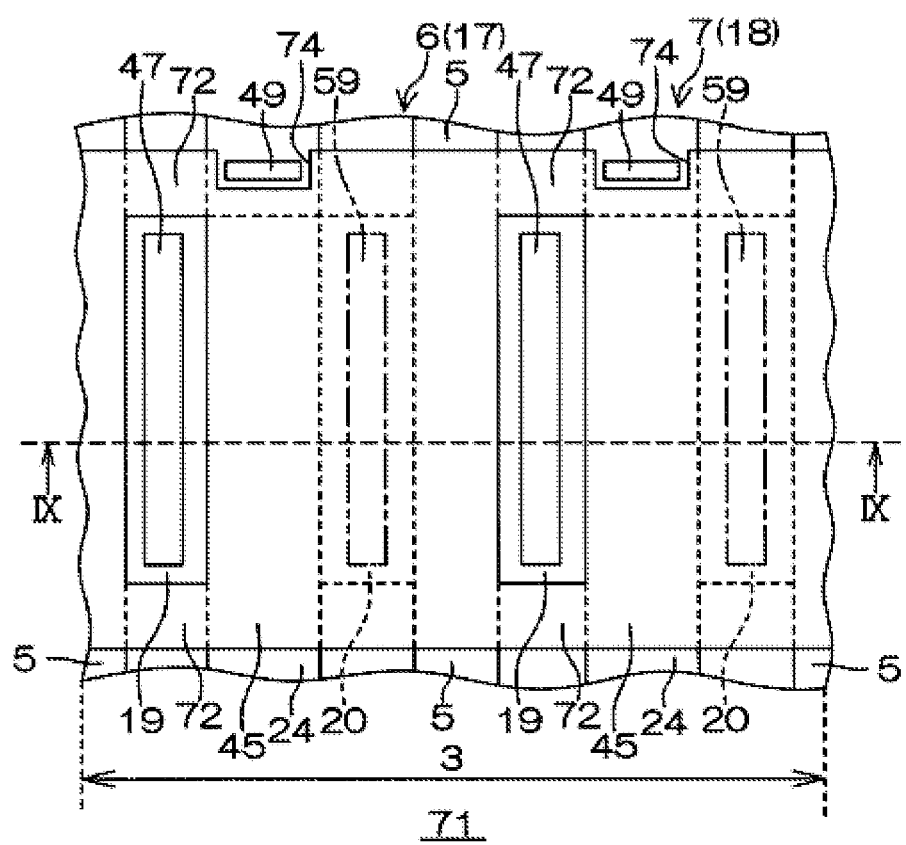
FIG. 8 is a schematic plan view of a semiconductor device according to Embodiment 3 of the present invention.
Figure 9:
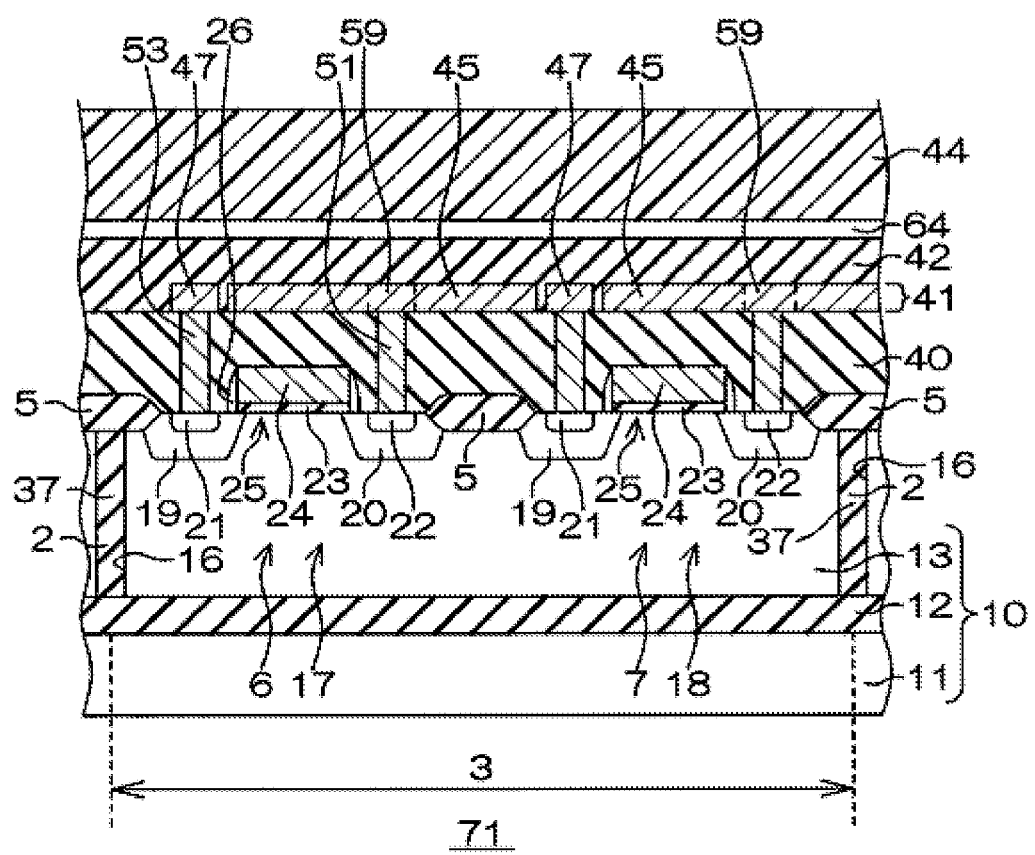
FIG. 9 is a cross-sectional view of FIG. 8 along the line IX-IX.

FIG. 8 is a schematic plan view of the semiconductor device 71 according to Embodiment 3 of the present invention. FIG. 9 is a cross-sectional view of FIG. 8 along the line IX-IX. In FIGS. 8 and 9, only the high voltage region 3 is shown with the low voltage region 4 not being shown, and in FIGS. 8 and 9, portions corresponding to those of FIGS. 3A, 3B, and 7B are assigned the same reference characters and descriptions thereof are omitted.

The semiconductor device 71 of Embodiment 3 has a configuration similar to that of the semiconductor device 1 except that the semiconductor device 71 includes the high refraction index passivation film 64 shown in FIG. 7B instead of the passivation film 43, and that the high voltage region conductive films 45 of the first and second HV-pMOSs 17 and 18 are formed integrally with each other. Description of the former difference has already been made in Embodiment 2 and will therefore be omitted, and the latter difference will be described in further detail.

In the semiconductor device 71, the wiring layer 41 further includes relay films 72 that electrically connect the high voltage region conductive films 45 of the first and second HV-pMOSs 17 and 18 to each other. The relay films 72 are formed integrally with both adjacent high voltage region conductive films 45 in both ends in the longer side direction of the HV drain region 19. In the present embodiment, as shown in FIG. 8, the relay films 72 avoid the HV drain region 19 by being disposed further outside than both longer side direction ends of the HV drain region 19. On the other hand, the HV drain region 19 has formed on both longer side ends thereof the relay films 72, and thus, is surrounded by the wiring layer 41 in a plan view (specifically by the high voltage region conductive films 45 and the relay films 72).

Effects similar to the aforementioned semiconductor device 1 can be attained even with the semiconductor device 71.

Next, with reference to FIGS. 10 and 11, a semiconductor device 81 of Embodiment 4 of the present invention will be described.

Figure 10:
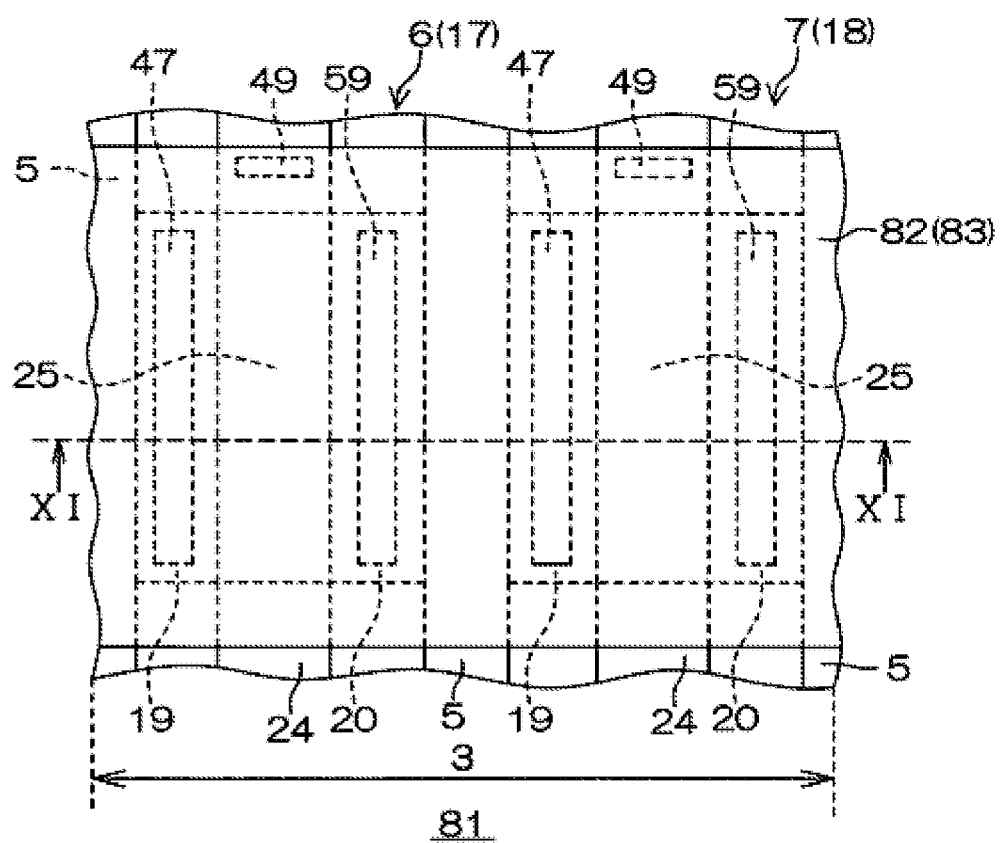
FIG. 10 is a schematic plan view of a semiconductor device according to Embodiment 4 of the present invention.
Figure 11:
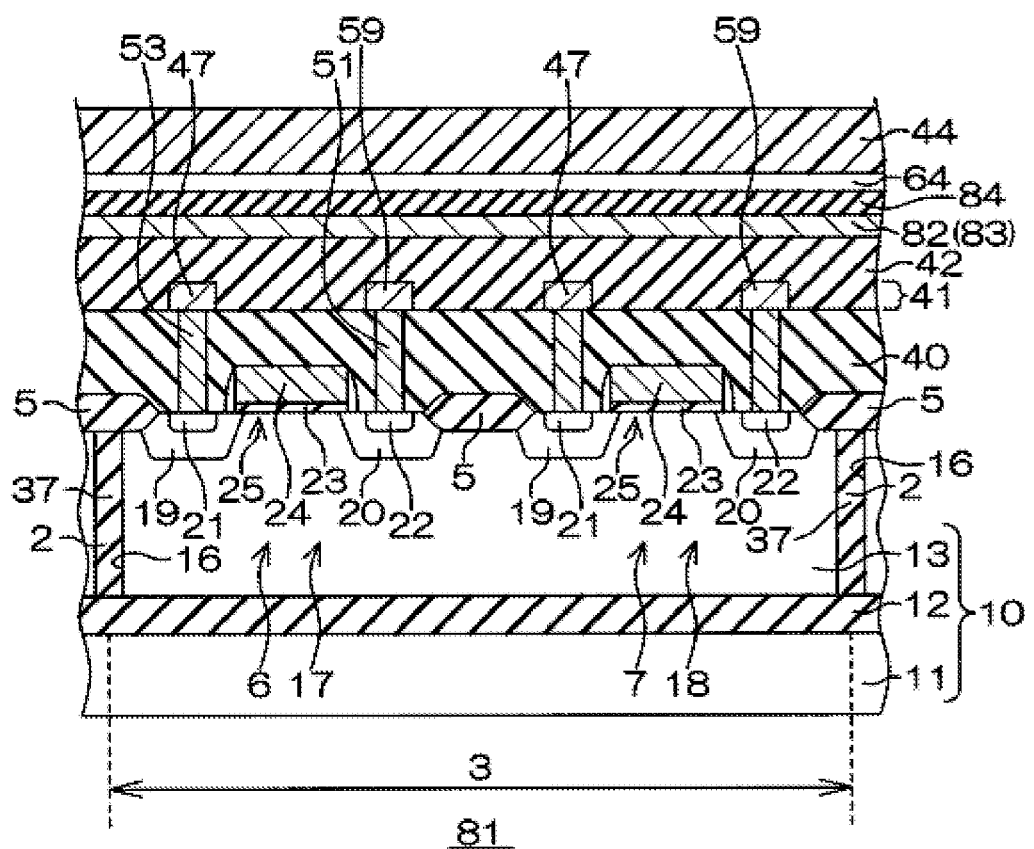
FIG. 11 is a cross-sectional view of FIG. 10 along the line XI-XI.

FIG. 10 is a schematic plan view of the semiconductor device 81 according to Embodiment 4 of the present invention. FIG. 11 is a cross-sectional view of FIG. 10 along the line X1-X1. In FIGS. 10 and 11, only the high voltage region 3 is shown and the low voltage region 4 is not shown. Also, in FIGS. 10 and 11, portions corresponding to the respective portions shown in FIGS. 3A, 3B, and 7B are assigned the same reference characters and descriptions thereof are omitted.

The semiconductor device 81 of Embodiment 4 has a similar configuration to that of the semiconductor device 1 except that the semiconductor device 81 includes the high refraction index passivation film 64 shown in FIG. 7B instead of the passivation film 43, and that the wiring film as an example of the conductive film of the present invention for mitigating leakage current in the respective regions 3 and 4 is formed in a wiring layer that is at a greater height than the wiring layer 41 that includes the HV source wiring film 59 and the like. Description of the former difference has already been made in Embodiment 2 and will therefore be omitted, and the latter difference will be described in further detail.

The semiconductor device 81 further includes a wiring layer 83 formed on the second interlayer insulating film 42, and a third interlayer insulating film 84 formed so as to cover the wiring layer 83 formed on the second interlayer insulating film 42.

The wiring layer 83 is an aluminum wiring film that is 1.0 μm to 3.0 μm in thickness, for example. The wiring layer 83 includes a conductive film 82 formed so as to cover the entire area of the high voltage region 3 and the entire area of the low voltage region 4. As in Embodiments 1 to 3, reference voltages corresponding to the respective regions 3 and 4 are applied to the conductive film 82. In the present embodiment, only the conductive film 82 of the wiring layer 83 is shown, but the wiring layer 83 may include a wiring film made of the same material and at the same thickness as the conductive film 82 in an area not shown. The wiring layer 83 may include wiring lines and the like drawn from the HV source wiring film 59, for example.

According to the semiconductor device 81 of Embodiment 4, as in Embodiments 1 to 3, the conductive film 82 to which the reference voltages corresponding to the respective regions 3 and 4 is applied are formed closer to the mold resin 44 than the epitaxial layer 13. Thus, effects similar to the semiconductor devices 1 and 71 of Embodiments 1 and 3 can be attained.

Also, in the semiconductor device 81, the conductive film 82 is formed in a different wiring layer than the HV drain wiring film 47 and the HV gate wiring film 49, and thus, there is no need to form the conductive film 82 so as to avoid the wiring films 47 and 49. As a result, it is possible to not only mitigate the occurrence of leakage current more effectively but to reliably form the conductive film 82 so as to cover the entire area of the high voltage region 3 and the entire area of the low voltage region 4 without depending on the wiring pattern of the wiring layer 41 formed on the first interlayer insulating film 40.

In the present embodiment, the conductive film 82 is formed as a portion of the wiring layer 83 that is adjacent in the up-and-down direction to the wiring layer 41 including the HV source wiring film 59, but by increasing the number of interlayer insulating films, a plurality of interlayer insulating films may be interposed between the conductive film 82 and the wiring layer 41, for example.

Embodiments of the present invention were described above, but the present invention can also be implemented in other embodiments.

In Embodiments 1 and 3, the high voltage region conductive film 45 and the low voltage region conductive film 46 are respectively formed integrally with the HV source wiring film 59 and the LV source wiring film 60, for example, but these need not be formed integrally. In other words, the high voltage region conductive film 45 and the low voltage region conductive film 46 may be formed so as to surround the HV source wiring film 59 and the LV source wiring film 60, for example, in areas other than where the HV source wiring film 59 and the LV source wiring film 60 are formed.

Also, in Embodiment 1, an example was described in which the passivation film 43 is formed, but a configuration that does not include the passivation film 43 may be adopted. Even in such a configuration, similar effects can be attained.

Also, in Embodiments 1 and 3, examples were described in which the conductive films 45, 46, and 73 are formed in the region D of the semiconductor devices 1 and 71, but the conductive films 45, 46, and 73 may be formed in a region other than the region D. Thus, the conductive films 45, 46, and 73 may be formed so as to selectively cover the entire area of the high voltage region 3 and the entire area of the low voltage region 4, for example. According to this configuration, it is possible to effectively mitigate the effect of the electric field on other semiconductor elements formed in the high voltage region 3 and the low voltage region 4.

In Embodiments 1, 3, and 4, examples were described in which the entirety of the field insulating films 5 was covered by the conductive films 45, 46, 73, and 83, but the configuration is not limited thereto, and effects can be attained as long as there is partial overlap with the field insulating films 5. It is preferable that the entirety of the field insulating films 5 be covered by the conductive films 45, 46, 73, and 83 as in Embodiments 1, 3, and 4.

Also, in Embodiments 1, 3, and 4, examples were described in which the conductive films cover the field insulating films 5, the HV channel region 25, and the LV channel region 35, but a configuration in which the conductive films cover only the field insulating films 5 and not the HV channel region 25 and the LV channel region 35 may be adopted. This is because the HV gate electrode 24 and the LV gate electrode 34 are respectively interposed between the mold resin 44, and the HV channel region 25 and LV channel region 35, and thus, the effect of field inversion is low.

Also, in Embodiments 1 to 4, examples were shown in which the field insulating films 5 are formed as an example of the insulating films of the present invention, but a trench separation structure in which trenches are filled with an insulating material may be adopted instead of the field insulating films 5. Such a trench separation structure can be formed by selectively forming trenches in the surface of the epitaxial layer 13, and then filling the trenches with an insulating material such as a silicon nitride or silicon oxide. The trenches may have a tapered shape in a cross-sectional view in which the trench narrows gradually, the further away it is from the surface of the epitaxial layer 13 in the thickness direction. Also, the trench separation structure may be attained by shallow trench isolation (STI).

In Embodiments 1 to 4, only a MOS transistor was described as an example of the semiconductor element formed in the high voltage region 3 and the low voltage region 4, but the semiconductor element is not limited thereto. Besides a MOS transistor, a CMOS (complementary MOS), a BJT (bipolar junction transistor), an IGBT (insulated gate bipolar transistor), a JFET (junction field effect transistor), a non-volatile memory having a control gate and a floating gate, or the like may be used.

The high voltage region 3 and the low voltage region 4 may have formed therein various circuit elements such as capacitors and resistors. Furthermore, integrated circuits such as those with LSI (large scale integration), SSI (small scale integration), MSI (medium scale integration), VLSI (very large scale integration), or ULSI (ultra large scale integration) may be used by a combination of the semiconductor elements, the circuit elements, and the like.

Even with the configuration above, by forming conductive films (the conductive films 45, 46, 73, and 83, for example) to which the reference voltages are applied, it is possible for the conductive films to reduce the effect of the electric field caused by the mobile ions in the mold resin 44.

If polysilicon resistors are formed in the high voltage region 3 and the low voltage region 4, for example, then there is a problem that the resistance of the polysilicon resistors is susceptible to changing due to the surrounding electric field. By forming the conductive films 45, 46, 73, and 83 of Embodiments 1 to 4 so as to cover the areas where the polysilicon resistors are formed, it is possible to attain a polysilicon resistor with a more stable resistance.

In the embodiments above, a configuration in which the conductive types of the semiconductor portions of the semiconductor device are inverted may be adopted. In the semiconductor device 1, the p-type portions may instead be n-type portions with the n-type portions being p-type portions, for example.

Besides these, various modifications in design can be made within the scope of the claims.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:
1. A semiconductor device, comprising:
   a semiconductor layer;
   at least one insulating film pattern that is formed on the semiconductor layer, defining a plurality of element formation regions therein;
   semiconductor elements formed in the element formation regions;

an interlayer insulating layer formed on the semiconductor layer;
a mold resin formed over the interlayer insulating layer; and
at least one conductive film formed in the interlayer insulating layer, the conductive film being disposed over at least either of the element formation regions and the insulating film pattern,
wherein the semiconductor elements include a MOS transistor including a gate insulating film formed on a surface of the semiconductor layer,
wherein the conductive film is at the same potential as a source region of the MOS transistor,
wherein the conductive film is made of a wiring film formed integrally with and in the same layer as a source wiring film connected to the source region of the MOS transistor, the conductive film extending to a region over a gate of the MOS transistor and the insulating film pattern,
wherein said conductive film is larger in area than a drain wiring film connected to a drain region of the MOS transistor so as to cover an area larger than an area covered by the drain wiring film in a plan view, said conductive film covering an entire width of the gate of the MOS transistor and an entire width of the insulating film pattern in the plan view, and
wherein the conductive film has a width and a length respectively greater than a width and a length of a channel region of the MOS transistor and a width and a length of the source region of the MOS transistor in the plan view so as to completely cover the channel region and the source region of the MOS transistor in the element formation region in the plan view.

2. The semiconductor device according to claim 1, further comprising a region separating structure in the semiconductor layer, the region separating structure separating the semiconductor layer into a low voltage region that operates at a low reference voltage and a high voltage region that operates at a high reference voltage that is higher than the low reference voltage,
wherein at least some of the plurality of element formation regions are included in the high voltage region, and
wherein said at least one conductive film includes a conductive film disposed over the high voltage region.

3. The semiconductor device according to claim 2,
wherein at least some of the plurality of element formation regions are included in the low voltage region, and
wherein said at least one conductive film includes a conductive film disposed over the low voltage region.

4. The semiconductor device according to claim 1, wherein the conductive film is disposed in a wiring layer directly above a gate of the MOS transistor.

5. The semiconductor device according to claim 1, wherein the conductive film is formed so as to avoid a portion of the drain region of the MOS transistor in a plan view from the direction perpendicular to the surface of the semiconductor layer.

6. The semiconductor device according to claim 1, wherein a passivation film made of silicon nitride and having an index of refraction of 2.0 or greater is disposed between the interlayer insulating film and the mold resin.

7. The semiconductor device according to claim 6, wherein the index of refraction of the passivation film is 2.3 or greater.

8. The semiconductor device according to claim 6, wherein the passivation film is in contact with the mold resin.

9. The semiconductor device according to claim 1, wherein said conductive film covers an entire region between the source region and the drain region of the MOS transistor in the plan view.

10. A semiconductor device, comprising:
a semiconductor layer;
at least one insulating film pattern that is formed on the semiconductor layer, defining a plurality of element formation regions therein;
semiconductor elements formed in the element formation regions;
an interlayer insulating layer formed on the semiconductor layer;
a mold resin formed over the interlayer insulating layer; and
at least one conductive film formed in the interlayer insulating layer, the conductive film being disposed over at least either of the element formation regions and the insulating film pattern,
wherein the semiconductor elements include a MOS transistor including a gate insulating film formed on a surface of the semiconductor layer,
wherein the conductive film is at the same potential as a source region of the MOS transistor,
wherein the conductive film is made of a wiring film formed integrally with and in the same layer as a source wiring film connected to the source region of the MOS transistor, the conductive film extending to a region over a gate of the MOS transistor and the insulating film pattern,
wherein said conductive film is larger in area than a drain wiring film connected to a drain region of the MOS transistor so as to cover an area larger than an area covered by the drain wiring film in a plan view, said conductive film covering an entire width of the gate of the MOS transistor and an entire width of the insulating film pattern in the plan view, and
wherein said conductive film has a width and a length respectively greater than or comparable to a width and a length of a region between the source region and the drain region of the MOS transistor so as to cover an entire region, inclusive of a channel region of the MOS transistor, between the source region and the drain region of the MOS transistor in the plan view.

11. The semiconductor device according to claim 10, further comprising a region separating structure in the semiconductor layer, the region separating structure separating the semiconductor layer into a low voltage region that operates at a low reference voltage and a high voltage region that operates at a high reference voltage that is higher than the low reference voltage,
wherein at least some of the plurality of element formation regions are included in the high voltage region, and
wherein said at least one conductive film includes a conductive film disposed over the high voltage region.

12. The semiconductor device according to claim 11,
wherein at least some of the plurality of element formation regions are included in the low voltage region, and
wherein said at least one conductive film includes a conductive film disposed over the low voltage region.

13. The semiconductor device according to claim 10, wherein the conductive film is disposed in a wiring layer directly above a gate of the MOS transistor.

14. The semiconductor device according to claim 10, wherein the conductive film is formed so as to avoid a portion of the drain region of the MOS transistor in a plan view from a direction perpendicular to the surface of the semiconductor layer.

15. The semiconductor device according to claim 10, wherein a passivation film made of silicon nitride and having an index of refraction of 2.0 or greater is disposed between the interlayer insulating film and the mold resin.

16. The semiconductor device according to claim 15, wherein the index of refraction of the passivation film is 2.3 or greater.

17. The semiconductor device according to claim 15, wherein the passivation film is in contact with the mold resin.

\* \* \* \* \*